United States Patent [19]

Inada et al.

[11] Patent Number: 4,990,417
[45] Date of Patent: Feb. 5, 1991

[54] METHOD OF MANUFACTURING A CATHODE RAY TUBE

[75] Inventors: Koki Inada, Chiba; Norihiro Tateyama, Saitama, both of Japan

[73] Assignee: Sony Corporation, Tokyo, Japan

[21] Appl. No.: 434,512

[22] Filed: Nov. 13, 1989

Related U.S. Application Data

[63] Continuation of Ser. No. 158,655, Feb. 22, 1988, abandoned.

[30] Foreign Application Priority Data

Feb. 23, 1987 [JP] Japan ................................ 62-39806
Feb. 24, 1987 [JP] Japan ................................ 62-40903

[51] Int. Cl.$^5$ .............................................. G03C 5/00
[52] U.S. Cl. ............................................ 430/28; 430/25;
430/26; 430/293; 430/270; 430/909; 313/364;
354/1; 358/242
[58] Field of Search ................... 430/4, 7, 23, 25, 26,
430/28, 27, 294, 29, 321, 904, 220, 320, 270;
358/242; 354/1; 315/364, 408; 525/61, 325

[56] References Cited

U.S. PATENT DOCUMENTS

| 3,615,462 | 10/1971 | Szegho et al. ........................ 430/25 |
| 3,661,580 | 5/1972 | Mayand ................................ 430/25 |
| 3,779,760 | 12/1973 | Miyaoka .............................. 430/25 |
| 3,788,846 | 1/1974 | Mayand et al. ...................... 430/25 |
| 3,881,928 | 5/1975 | Gravesteijn et al. ................. 430/25 |
| 4,070,596 | 1/1978 | Tsuneta et al. ...................... 430/25 |
| 4,243,735 | 1/1981 | Kubale et al. ........................ 430/25 |
| 4,251,610 | 2/1981 | Haven et al. ........................ 430/25 |
| 4,339,524 | 7/1982 | Ichimura et al. .................... 430/28 |

Primary Examiner—Ellis P. Robinson
Assistant Examiner—Donald J. Loney
Attorney, Agent, or Firm—Hill, Van Santen, Steadman & Simpson

[57] ABSTRACT

A method for forming a phosphor pattern on a panel of a cathode ray tube to prevent the peeling of a black matrix from the glass panel when treated with an inversion solvent which involves forming a protective film of a transparent photosensitive material on a glass panel on which a black matrix is formed and using the so-called outer surface exposure method to produce a color cathode ray tube having high definition.

5 Claims, 6 Drawing Sheets

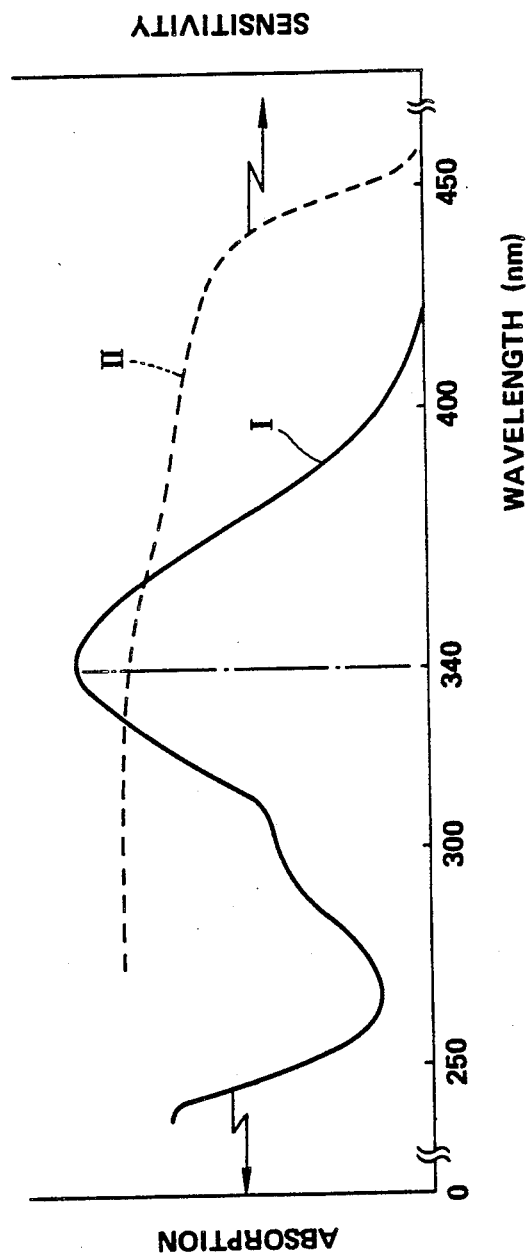

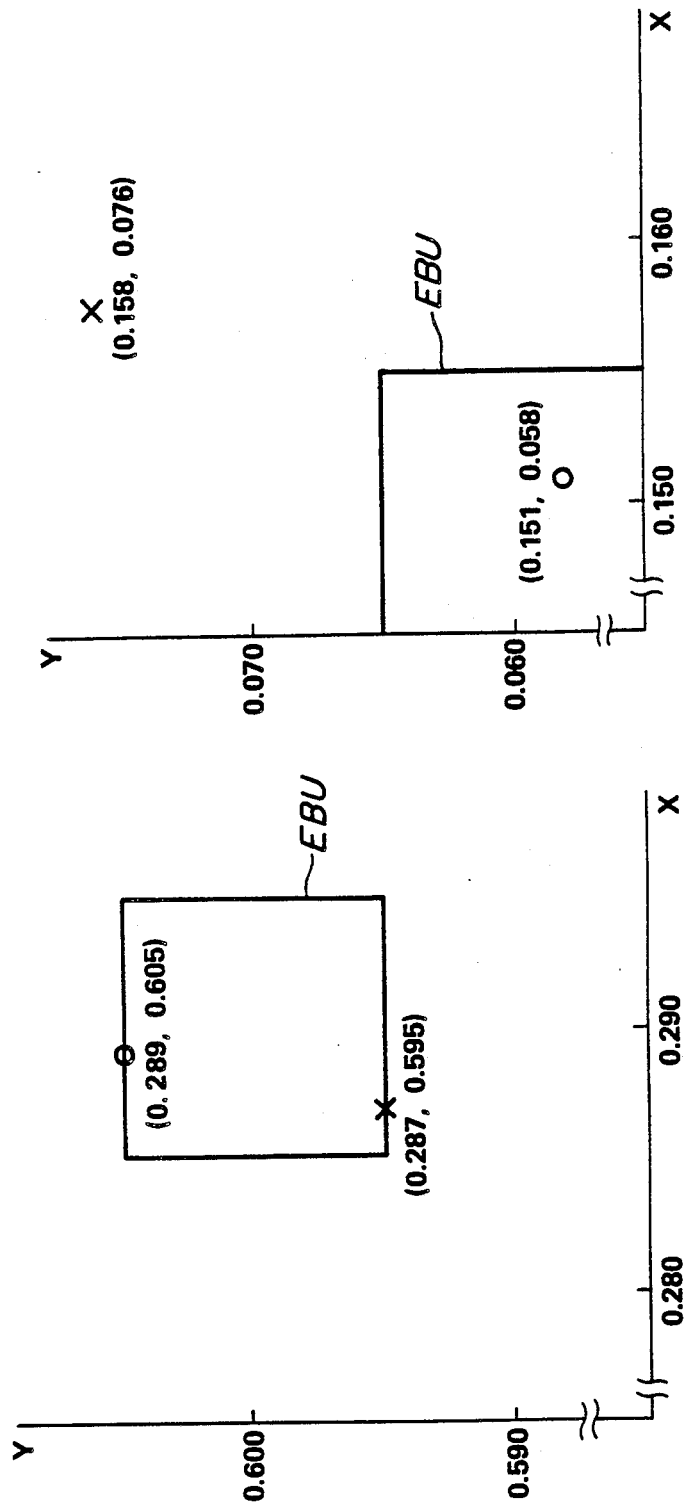

METHOD OF MANUFACTURING A CATHODE RAY TUBE

This is a continuation of application Ser. No. 158,655, filed 2/22/88.

BACKGROUND OF THE INVENTION

1. Field of the Invention

The present invention relates to a method for the manufacture of a phosphor pattern on a panel of a color cathode ray tube having ultra fine definition, and more particularly, to a method for preventing peeling of a black matrix (carbon stripe) using the outer surface exposure method.

2. Description of the Prior Art

For reproducing an ultra fine definition picture on a color cathode ray tube, it is necessary that the respective phosphor stripes or dots of ultra fine definition of the three primary colors be clearly separated on the phosphor screen by a black matrix as the light absorptive layers. If the separation is not perfect, the effect of mislanding of electron beams becomes strongly exhibited in the actual operating state, when various errors are considered, resulting in marked deterioration of the picture quality. Thus research has been conducted into finding a method for forming the phosphor screen having clear edges of the respective phosphors and a high packing density.

The most customary method for the manufacture of color cathode ray tubes is the so-called inner surface exposure method according to which a phosphor slurry with a pigment dispersed in a light reactive resin is coated onto a glass panel on which carbon stripes of a predetermined pattern are formed and then exposed to light through an optical mask. The non-cured portions are removed by development, and the above sequence of operations is sequentially repeated for the red, green and blue colors in the production of the stripe type color phosphor surface.

The assignee of the present invention has also proposed a so-called outer surface exposure method according to which the admixture of colors between adjoining stripes is prevented by using two kinds of photosensitive agents having differential inversion capabilities, as disclosed in Japanese Laid-open Patent Application No. 119055/1985. According to this method, the phosphor surface is prepared by coating and curing in a predetermined sequence, on the glass panel on which carbon stripes have been previously formed, a resist layer using a first sensitizer which can be inverted by aqueous hydrogen peroxide and a phosphor slurry obtained by dispersing a phosphor dyestuff in a second photosensitizer which is not inverted by hydrogen peroxide.

In the above described inner surface exposure method, the phosphor stripes are printed through an optical mask, which presents a problem because of a half shadow. In addition, due to the problem of insufficient adhesiveness between the phosphor stripes and the inner surface of the glass panel, it is difficult to form phosphor stripes having finely defined, clear edges.

In the outer surface light exposure method, the above defect of the conventional inner surface light exposure method has been eliminated but one problem remains to be solved. In the outer surface light exposure method, one inversion is caused to occur necessarily when forming the phosphor stripes of each color, so that three of the inversions are required to complete forming stripes of the three colors. However, with the repetition of the inversion of the resist layer, that is, solution and removal, the carbon stripe containing the resist layer is eroded a little by little until it is peeled off to lower the quality of the produced phosphor screen surface.

SUMMARY OF THE INVENTION

The present invention seeks to provide a method capable of preventing the peeling of carbon stripes without markedly changing the above steps.

This invention provides a method for producing a color cathode ray tube characterized in that it comprises forming a light absorptive layer of a predetermined pattern on the inner surface of a cathode ray tube panel, coating a photosensitive resin to cover the overall surface of the panel, and exposing the overall surface to light to form a protective layer. A phosphor stripe of a first color is formed by forming a resist layer on portions other than the portions coated by the phosphor slurry of the first color, coating the phosphor slurry obtained by admixing a photosensitive agent with a phosphor of the first color, the agent being removed by the inverting agent for the resist layer, exposing the overall surface from the outer panel surface for development, and removing the phosphor of the other portions simultaneously with the resist layer by using the inverting agent. This process is repeated at least to form a phosphor of a second color.

When a protective film of a transparent light-curable resin which does not undergo depolymerization by aqueous hydrogen peroxide is previously provided on a glass panel on which carbon stripes are formed, these stripes are completely isolated by the protective film from the resist layer or phosphor stripes to be formed in the subsequent steps, so that there is no risk of peeling even after repetition of the inversion steps. Also, the protective film is optically transparent and does not obstruct light irradiation to be performed in the subsequent step.

BRIEF DESCRIPTION OF THE DRAWINGS

FIG. 1 is a spectrum diagram showing the absorption and sensitivity of a polyvinyl alcohol-stilbazolium photosensitive resin as a material for the protective film;

FIG. 2(A) shows the step of forming carbon stripes;

FIG. 2(B) shows the step of forming a protective film;

FIG. 2(C) shows the step of applying a polyvinyl alcohol-ammonium dichromate photosensitive liquid;

FIG. 2(D) shows the step of light exposure of the inner surface;

FIG. 2(E) shows the step of forming a PVA-ADC resist layer;

FIG. 2(F) shows the step of applying a green phosphor slurry and the step of light exposure of the outer surface;

FIG. 2(G) shows a development step;

FIG. 2(H) shows the step of forming green phosphor stripes by inversion development; and FIG. 2(I) shows the arrangement of green, red and blue phosphor stripes after their formation;

FIGS. 4(A) and 4(B) are X-Y chromaticity diagrams showing the color purity of phosphor stripes observed on the color cathode ray tubes, FIG. 4(A) showing the color purity of the green phosphor stripes, and FIG. 4(B) showing the color purity of the blue phosphor stripes.

DESCRIPTION OF THE PREFERRED EMBODIMENTS

Figure 2A:
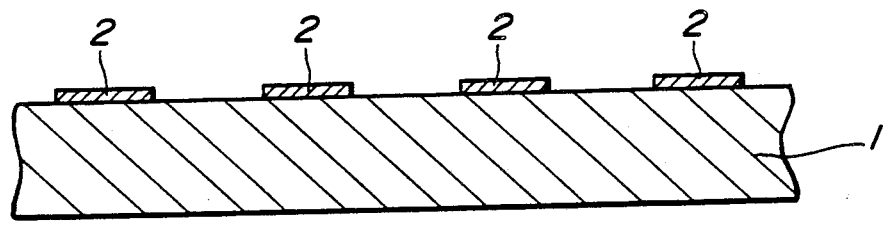
FIGS. 2(A) to (I) are sectional views on an enlarged scale showing a typical example of a method for the step-by-step preparation of a color cathode ray tube screen using the method of the present invention.

The first step in forming the phosphor surface of the color cathode ray tube involves forming the carbon stripes. A photosensitizing liquid of polyvinyl alcohol (PVA) is coated and dried on the inner surface of a glass panel for a color cathode ray tube. Then, an ultraviolet exposure is performed using an apertured grill as an optical mask. The ultraviolet light source is precisely positioned at the deflection center of each of the red, green and blue light sources, and the light exposure is repeated three times. Upon developing the panel, resist layers including numerous stripes are formed at the positions corresponding to the phosphor stripes of the respective colors. The overall surface of the panel is then coated with a carbon slurry and dried, after which the process of inversion is carried out whereby the carbon on the resist is peeled off along with the resist layer, thus forming a plurality of carbon stripes 2 about 1 micron in thickness on a glass panel 1 as shown at FIG. 2(A).

The protective layer is then formed. The materials used for the protective layer should have properties such as improved adhesion to the black matrix or the carbon stripes, adhesion to the glass panel, good wettability and the capacity to be thinly and uniformly coated on the black matrix and the glass panel, optical transparency, sufficient film coating strength, and the capacity of not being dissolved in the inverting developing agent. Materials satisfying these requirements include polyvinylpyrrolidone-azide type photosensitive resins, diazotype photosensitive resins, and polyvinyl alcohol-stilbazolium type photosensitive resins, hereinafter referred to as PVA-SBQ photosensitive resins. The PVA-SBQ photosensitive resins are the most preferred in that they satisfy all of the above conditions. The structural formula of the PVA-SBQ photosensitive resin is expressed as follows:

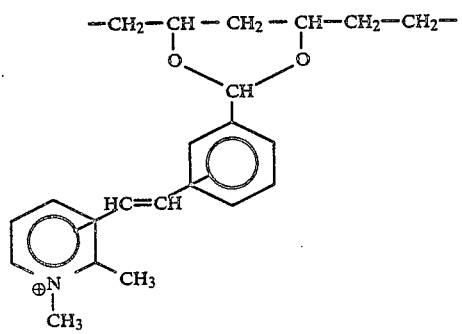

This photosensitive resin is one in which the side chain of the stilbazolium group is bonded to the main chain of polyvinyl alcohol through an acetal structure. Since the side chain is a quaternary ammonium salt, the resin itself is sufficiently hydrophilic for practical purposes.

The PVA-SBQ photosensitive resin is prepared as an aqueous solution with a 1.5% concentration and is coated on the entire surface of the glass panel 1 on which the carbon stripes 2 are formed. A concentration of the PVA-SBQ photosensitive resin of 0.5 to 3% is sufficient. With a concentration lower than the stated range, the coating tends to be thin with uneven coating and the peeling of the carbon stripes can not be prevented completely. With a concentration higher than the above range, the coating tends to be so thick that light cross-linking tends to occur while the coating film strength tends to be insufficient so that the coating tends to be peeled off at the time of inversion.

Figure 2B:
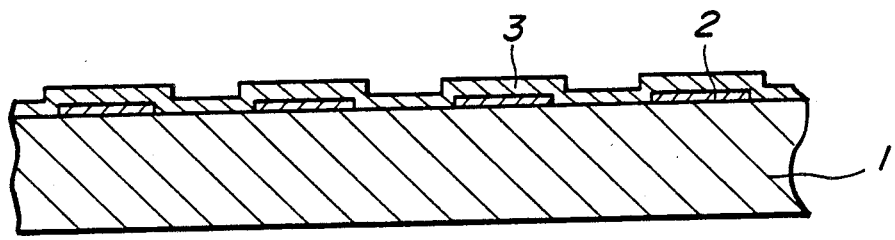

The PVA-SBQ photosensitive resin is then polymerized by light irradiation. For this step, it is necessary to know the opto-chemical properties of the photosensitive resin. FIG. 1 shows an absorption curve I for the PVA-SBQ photosensitive resin and a sensitivity curve II for the light polymerization. It can be seen from this figure that the PVA-SBQ photosensitive resin has an absorption maximum at 340 nm with the sensitivity being good from the ultraviolet range to the vicinity of 450 nm in the visible range. Thus, ultra-high voltage mercury lamps, UV fluorescent lamps or blue lamps safe to the eyes may be employed. The volume of light exposure should be not less than 50 mJ to assure sufficient coating film strength. With such light exposure, the PVA-SBQ photosensitive resin undergoes photopolymerization and cures to form a protective film 3 having a thickness of 0.2 to 1 micron as shown in FIG. 2(B).

Figure 2C:
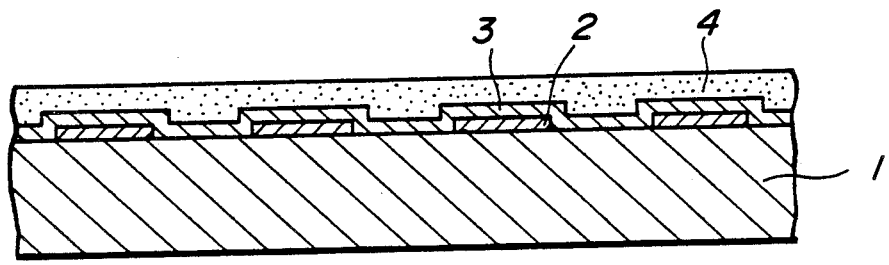

Next, a photosensitive liquid 4 of polyvinyl alcohol containing a minor amount of ammonium dichromate, referred to PVA-ADC, is coated and dryed on the protective film 3 as shown in FIG. 2(C).

Figure 2D:
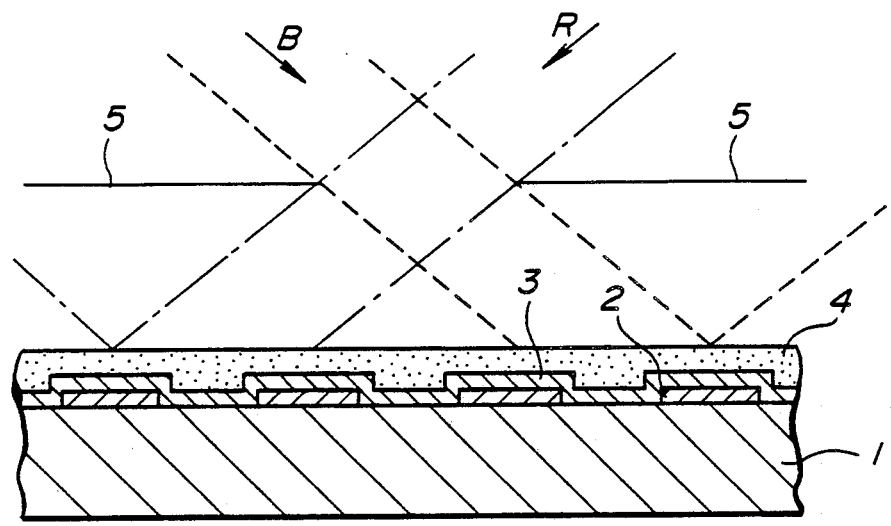
Figure 2E:
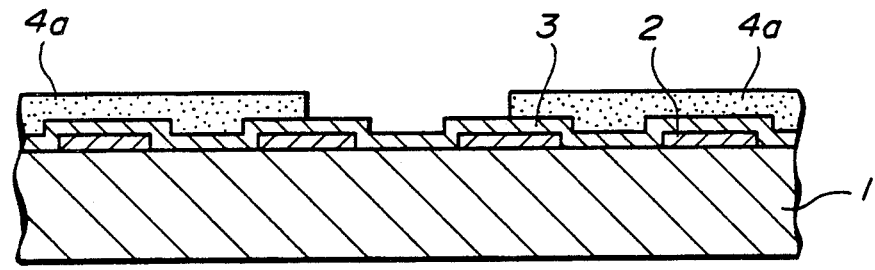

Then, as shown in FIG. 2(D) a light exposure is performed by the usual method, using an apertured grill 5 as an optical mask. When forming green phosphor stripes, for example, the positions corresponding to the red and blue stripes are covered with the apertured grill 5 and the exposure is made from the directions of R (red) and B (blue) in the drawing. The portions thus exposed to light are cured by photopolymerization to form a PVA-ADC resist layer 4a, while the unexposed portions are removed by washing with water to produce the structures shown in FIG. 2(E). The PVA-ADC resist layer 4a may be inverted (i.e., dissolved and removed) by aqueous hydrogen peroxide.

Figure 2F:
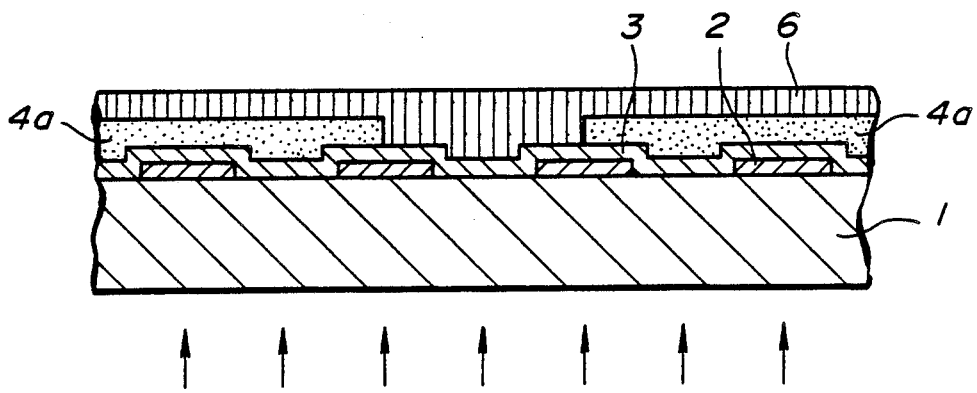

Then, as shown in FIG. 2(F), the green phosphor slurry 6 in which the green phosphor is dispersed in the PVA-SBQ photosensitive resin is coated on the entire inner surface of the panel, as shown in FIG. 2(F) and the total light exposure is performed from the outer surface of the panel.

Figure 2G:
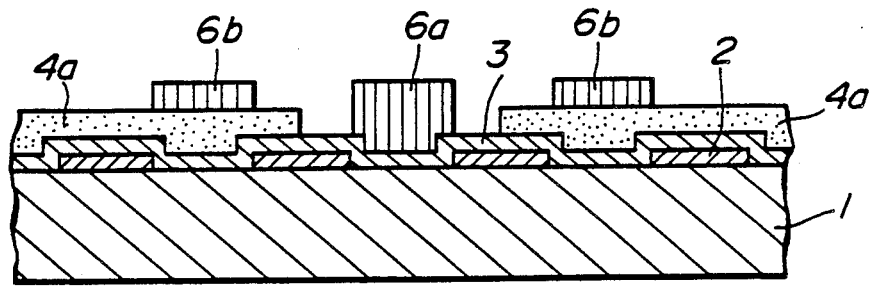

The PVA-SBQ photosensitive resin is not inverted by aqueous hydrogen peroxide. When the panel is developed, the green phosphor slurry is removed, with the green phosphor cured portion 6b and the green phosphor strips 6a cured by the photopolymerization remaining so that the structure shown in FIG. 2(G) is now achieved. The green phosphor cured portion 6b also remains on the PVA-ADC resist layer 4a. This is because the irradiated light reaches the PVA-ADC resist layer 4a which is transparent to cause photopolymerization.

Figure 2H:
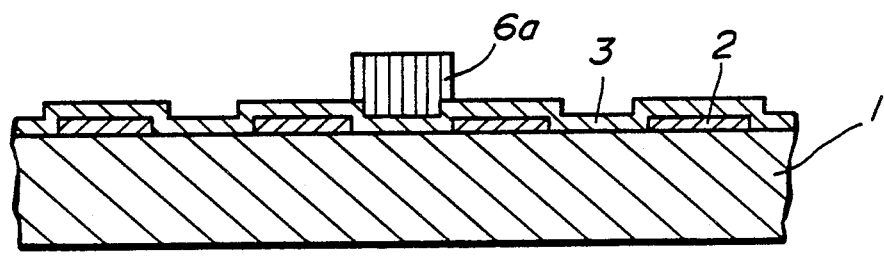

The product in this state is immersed in aqueous hydrogen peroxide as the inverter liquid to effect inversion development whereby the PVA-ADC resist layer 4a is dissolved and removed while simultaneously, the green phosphor cured portion 6b formed on the resist layer 4a is also removed. As a result, only the green phosphor stripes 6a being 15 to 20 microns thick are left, as shown in FIG. 2(H).

Figure 2I:
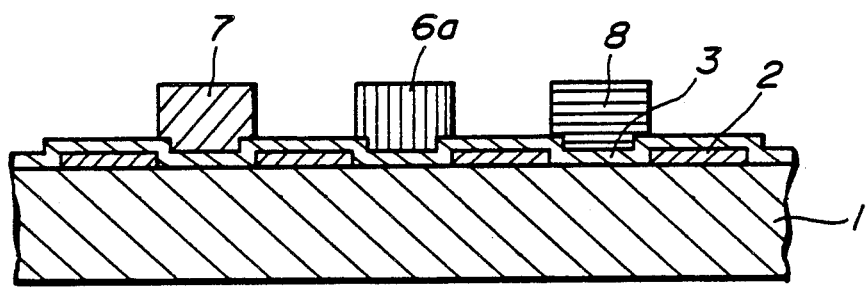

The steps shown in FIGS. 2(C) to 2(H) are similarly repeated for the remaining colors, whereby the red phosphor stripes 7 and the blue phosphor stripes 8 are ultimately removed as shown in FIG. 2(I) to complete the phosphor screen surface.

In the present embodiment, no peeling of the carbon stripes is observed, and a good phosphor screen surface is obtained.

From the foregoing it will be seen that, in accordance with the present invention, when the PVA-SBQ photosensitive resin is previously coated before formation of the phosphor stripes, peeling of the carbon stripes that presented problems in the prior art method may be effectively prevented so that a color cathode ray tube having high picture quality may be obtained. Since the protective film and the phosphor stripes formed thereon are made of the same material, adhesiveness of the phosphor stripes to the panel is improved and a color cathode ray tube having a highly reliable phosphor screen may be provided without substantially altering the conventional manufacturing process.

It should be noted that, in the aforementicned method, at least one inversion process with aqueous hydrogen peroxide must be carried out for forming a phosphor stripe of one color, so that three inversion processes need to be carried out until completion of the three phosphor color stripes. However, when the inversion, that is, the removal by dissolution of the resist layer is performed repeatedly, the phosphors in the phosphor stripes and, above all, the green and blue phosphors, are gradually eluted by the aqueous hydrogen peroxide, resulting in lowering of the color purity or brilliance of the phosphor screen.

In view of this difficulty, the phosphor for the color cathode ray tube may be coated with an acid resistant film.

Any type of phosphor normally employed in a color cathode ray tube may be employed in the present invention such as zinc sulfide, zinc sulfide cadmium, zinc sulfur selenide, zinc oxide, zinc silicate, gadlinium oxysulfide, lanthanum oxysulfide, yttrium aluminate, yttrium aluminate-gadlinium, strontium thiosulfate-gallium, yttrium oxysulfide or yttrium silicate, these being activated by metal elements such as copper, aluminum, gold, silver, maganese, arsenic, terbium, cerium or europium, depending on the color desired. Above all, the utmost effect may be derived from application of a phosphor of the zinc sulfide type.

The coating material employed for forming the coating film for the phosphor must be insoluble in the inverting agents such as aqueous hydrogen peroxide, and must show affinity to the phosphor while not obstructing the coloring effect on the phosphor, and should have sufficient film forming properties. These coating materials include acrylic resins (polymethylmethacrylate, polymethacrylate), acrylic monomers, polystyrene, polyvinyl acetate, polyvinyl alcohol, and a mixture of gelatine and gum arabic. The first named four materials are suitable for practical purposes, while the latter two, namely, polyvinyl alcohol and the mixture of gelatine and gum arabic are slightly poorer in coating film strength although they have sufficient water resistance.

In the coating procedure, the phosphor is suspended in water and the suspension is mixed with an emulsion of the above coating material with water as the dispersion medium, after which the pH is adjusted to a predetermined value and the resulting phosphor is washed with water and dried.

The coated phosphor thus obtained may be coated with $SiO_2$ to improve dispersibility in the photosensitive resin.

The above coating material, applied in the form of a water-soluble emulsion, forms a uniform coating on the phosphor surface. Thus the phosphor and the inverting agent such as aqueous hydrogen peroxide are separated by the acid-resistant coating even during the inversion development for effectively preventing phosphor elusion and deterioration.

An example of a coated phosphor is hereafter given.

A coating is first applied to the phosphor. 500 g of the phosphor were suspended in 1 l of water and the resulting suspension was mixed with 1 to 5 ml of an anionic acrylic emulsion with a concentration of 40%. A small amount of the pigment was added to adjust the chromaticity in accordance with various standards concerning the cathode ray tube. The amount of addition of green phosphor was 0.5 to 1 weight percent, that for the blue phosphor was 1 to 1.5 weight percent and that for the red phosphor was 0.05 to 0.1 weight percent. The above described mixture was stirred for 5 to 10 minutes at room temperature until a thorough dispersion was obtained. Then, 0.3 to 2 ml of a cationic acrylic emulsion with a 40% concentration was added to improve the adhesivity and the pH was adjusted to 4 to 7 by using ammonia and hydrochloric acid. The coated phosphors were washed with water and dried after removal of the washing water by decantation. In this manner, an acid-resistant phosphor was obtained in which the pigment was retained on the surface and which was coated in its entirety by an acrylic resin.

In the present example, europium activated yttrium oxysulfide, copper activated zinc sulfide and aluminum activated sinc sulfide were used as a red, green and blue phosphors, respectively.

The above described acid-resistant phosphors were further coated with $SiO_2$ to improve their coatability.

Figure 3C:
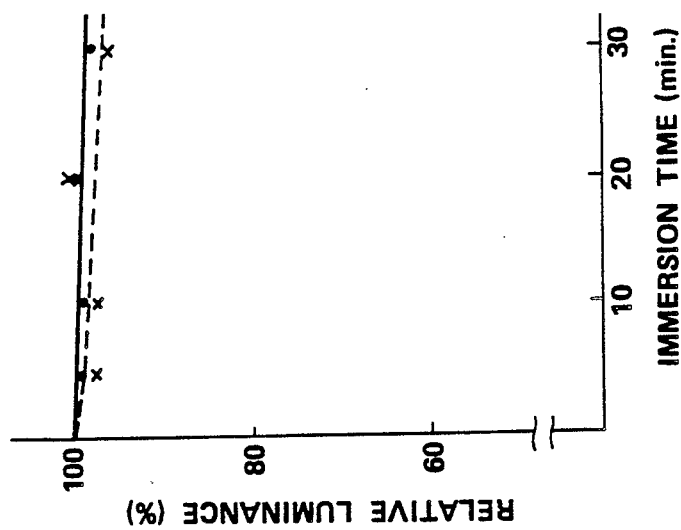
FIGS. 3(A) to 3(C) are diagrams showing the reduction in luminance in the case of immersing the respective phosphors in aqueous hydrogen peroxide, FIG. 3(A) showing the luminance characteristics of the green phosphors, FIG. 3(B) showing luminance characteristics of the blue phosphors and FIG. 3(C) showing the luminance characteristics of the red phosphors.
Figure 3B:
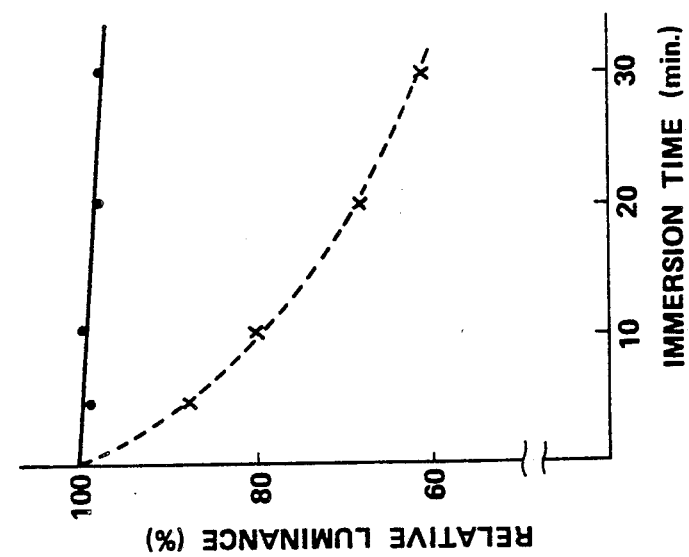
Figure 3A:
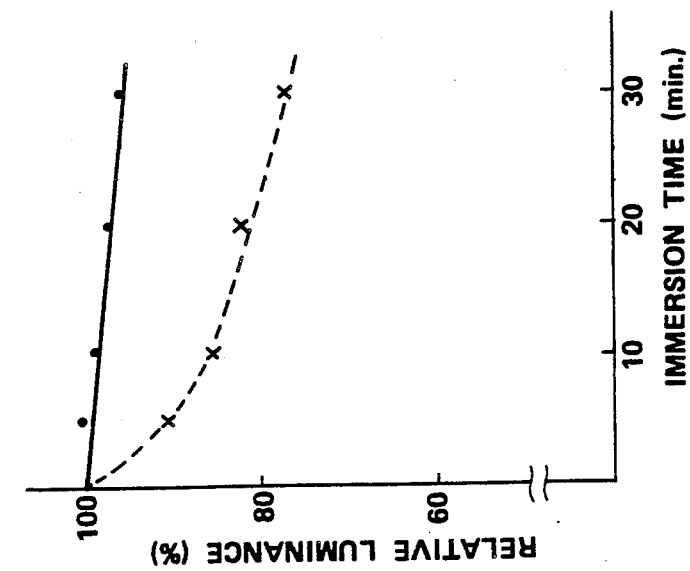

The acid-resistant phosphors for the respective colors were dispersed in the polyvinyl alcohol-stilbazolium type photosenstive resin to produce a slurry which was coated on the glass panels for the cathode ray tube, dried, and cured by irradiation with light. Only one half of the respective glass panels was immersed in aqueous hydrogen peroxide at a concentration of 15% and a temperature of 40° C., removed after a certain time, washed with water, and dried. The entire panel surface was coated with aluminum by evaporation and irradiated with electron beams in vacuum and the luminance was measured. FIGS. 3(A) to 3(C) show the result of a comparison of the portions immersed and not immersed in aqueous hydrogen peroxide. In these figures, the immersion time in minutes in aqueous hydrogen peroxide was plotted on the abscissae, and the relative luminance (percent) of the immersed portion relative to the luminance (100) of the portion not treated with aqueous hydrogen peroxide was plotted as the ordinate. The broken line indicates the luminance properties of the usual phosphor not having an acid resistant coating and the solid line indicates the luminance properties of a phosphor provided with the acid-resistant film of the present invention. It is seen that while there is not any marked difference between the red phosphor having an acid resistant film and that not having the film as shown in FIG. 3(C) there is a marked improvement in the luminance achieved with the green phosphor shown in FIG. 3(A) and the blue phosphor shown in FIG. 3(B).

In order to check the effect of the acid-resistant coating on the color purity for each color, stripe type phosphor surfaces were prepared in accordance with the aforementioned procedure by using a phosphor provided with an acid-resistant coating and another not provided with the acid-resistant coating.

The phosphor screen thus formed was incorporated into a cathode ray tube, and the chromaticity was measured with the single green and blue light raster in connection with green and blue phosphors that underwent considerable lowering in the luminance in the above described immersion tests in aqueous hydrogen proxide. FIGS. 4(A) and 4(B) show the result of an X-Y chromaticity diagram. In these drawings, the portions surrounded by the solid line square represents the permissible range of color purity under the EBU (European Broadcastors' Union) while the mark O represents the chromaticity of the phosphor stripes provided with an acid-resistant coating or film and the mark X represents the chromaticity of the phosphor stripes employing the usual phosphor not having the acid-resistant coating or film. It can be seen that color purity was not lowered in the green phosphor stripes shown in FIG. 4(A) and in the blue phosphor stripes shown in FIG. 4(B) but actually showed an improvement.

It will be seen from the foregoing that when the acid-resistant coating is applied to the phosphors used in the phosphor screen prepared by outer surface light exposure, elusion or deterioration of the phosphors by an inverting agent such as aqueous hydrogen peroxide is markedly lowered resulting in preventing a color admixture between the adjacent color stripes and preventing lowering in luminance with improvement in color purity.

It will be evident that various modifications can be made to the described embodiments without departing from the scope of the present invention.

We claim:
1. A method for forming a phosphor pattern on a panel of a color cathode ray tube which comprises:
  forming a light absorptive layer in a predetermined pattern on the inner surface of said panel,
  coating said inner surface with a protective layer covering the entire surface of said absorptive layer, with a photosensitive resin which is not dissolved in aqueous hydrogen peroxide after exposure to light, said photosensitive resin being selected from the group consisting polyvinylpyrrolidone-azide photosensitive resins, diazo photosensitive resins and polyvinyl alcohol-stilbazolium photosensitive resins,
  forming a phosphor strip of a first color by:
    (a) forming a resist layer on portions of said protective layer other than the portion to be occupied by said first color,
    (b) coating said resist layer with a phosphor slurry containing a photosensitive agent and a phosphor of said first color, said agent being non-removable by an inverting agent which removes said resist layer,
    (c) exposing the overall surface from the outer surface of said panel,
    (d) developing the exposed slurry layer and
    (e) removing the resist layer on said portions other than the portion occupied by said first color through the use of said inverting agent and repeating the steps of forming said phosphor strip for at least one additional color.

2. A method according to claim 1, wherein said photosensitive resin is a polyvinyl alcohol-stilbazolium resin in which a side chain of the stilbazolium group is bonded to a main chain of polyvinyl alcohol through an acetal structure.

3. A method according to claim 1, wherein the thickness of said protective layer is from 0.2 to 1 um.

4. A method according to claim 1, wherein the surface of said phosphor is coated with an acid-resistant film.

5. A method according to claim 4, wherein said acid-resistant film contains an acrylic resin.